(12) United States Patent
Hanke et al.

(10) Patent No.: US 7,218,163 B2
(45) Date of Patent: May 15, 2007

(54) RADIO-FREQUENCY MIXER ARRANGEMENT

(75) Inventors: André Hanke, Düsseldorf (DE); Martin Simon, Otterfing (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 10/981,345

(22) Filed: Nov. 4, 2004

(65) Prior Publication Data

US 2005/0130619 A1  Jun. 16, 2005

(30) Foreign Application Priority Data

Nov. 5, 2003 (DE) .................. 103 51 606

(51) Int. Cl.
*G06F 7/44* (2006.01)

(52) U.S. Cl. ...................... 327/358; 327/359

(58) Field of Classification Search ............. 327/355, 327/356, 358, 361, 359
See application file for complete search history.

(56) References Cited

U.S. PATENT DOCUMENTS 5,630,228 A * 5/1997 Mittel ..................... 455/326

2004/0174199 A1 * 9/2004 Simon ..................... 327/256

FOREIGN PATENT DOCUMENTS

DE        101 32 802 A1      11/2002
DE        10132802 A1  *    11/2002

* cited by examiner

*Primary Examiner*—Long Nguyen
(74) *Attorney, Agent, or Firm*—Eschweiler & Associates, LLC

(57) ABSTRACT

The present invention relates to a radio-frequency mixer arrangement in which a differential amplifier is connected to an input on a multiplier. The differential amplifier is arranged together with at least one capacitance in the feedback path of an operational amplifier. The at least one capacitance performs the function of an antialiasing filter. The feedback operational amplifier with the design described results in a highly linear output signal given low output noise and a low current requirement. The mixer proposed is particularly suitable for use in vector modulators or polar modulators in transmission paths in mobile radios.

16 Claims, 2 Drawing Sheets

RADIO-FREQUENCY MIXER ARRANGEMENT

REFERENCE TO RELATED APPLICATIONS

This application claims the benefit of the priority date of German application DE 103 51 606.9, filed on Nov. 5, 2003, the contents of which are herein incorporated by reference in their entirety.

FIELD OF THE INVENTION

The present invention relates to a radio-frequency mixer arrangement.

BACKGROUND OF THE INVENTION

Radio-frequency mixer arrangements are used, by way of example, in vector modulators in order to convert a baseband signal which has undergone digital or analog modulation to a transmission frequency level. A vector modulator is constructed using integrated circuitry, normally with Gilbert multiplier cells.

An integrated multiplier circuit which is suitable for use in vector modulators in radio transmission appliances is described by way of example in the document DE 101 32 802 A1. The multiplier circuit in this document has two input terminal pairs which are used for supplying a first and a second signal which are to be multiplied. In this case, the resultant frequency of the multiplied signals is obtained from the sum of, or from the difference between, the input signal frequencies. One of the two inputs of the known multiplier circuit has voltage/current converters which are connected to the multiplier input via current mirrors. This improves the noise characteristics.

Besides good noise characteristics, however, improved linearity is demanded of vector modulators, particularly in respect of such modulation methods as take account of the constantly rising data rates.

The linearity of a Gilbert multiplier cell is proportional to the product of operating current and feedback resistances in the differential amplifiers. To achieve sufficient linearity and high gain, the differential amplifiers normally need to be supplied with a correspondingly large operating current. The feedback resistances and the operating current are the primary cause of the noise at the modulator output, besides the oscillator's phase noise. In addition, the predominant use of such integrated transmission arrangements in mobile radios, which are battery-powered, means that a low drawn current is desirable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a radio-frequency mixer arrangement which is suitable for use in vector modulators and has improved linearity characteristics over the prior art.

The invention includes a radio-frequency mixer arrangement, having a multiplier, and a differential amplifier which is coupled to an input on the multiplier. An operational amplifier is further included and has a feedback path which contains the differential amplifier. The mixer arrangement has a first signal input, which is coupled to an input on the operational amplifier, a second signal input, which is connected to a further input on the multiplier, and at least one capacitance in the feedback path between an output of the differential amplifier and an input of the operational amplifier, wherein said capacitance is configured as an antialiasing filter.

In accordance with the present invention, the differential amplifier in a multiplier cell is linearized by virtue of the operational amplifier's feedback path having a filter characteristic implemented in it which performs an antialiasing filter function. The control characteristics resulting from the operational amplifier mean that the output signal from the differential amplifier is highly linear.

On the basis of the present invention, the differential amplifier in the mixer cell and the antialiasing filter are not different circuit blocks, but rather are combined with the operational amplifier's feedback path and form a unit. The control loop with the operational amplifier means that substantially no distortions arise at the operational amplifier output.

In line with one preferred development, the differential amplifier comprises two differential transistors each having a respective control input, the control inputs being connected to a respective output connection of an output terminal pair on the operational amplifiers. The output terminal pair of the operational amplifier is designed for tapping off a differential signal, a "differential output signal".

The control in the form of a differential signal and the design of the operational amplifier with a differential output significantly improve the common-mode rejection.

The antialiasing filter in accordance with one aspect of the present invention is preferably designed as a filter with a multiple-order filter characteristic.

The antialiasing filter preferably has low-pass characteristics.

The antialiasing filter preferably suppresses multiples of the sampling frequency.

The antialiasing filter is preferably designed as a baseband filter with a current output.

The differential amplifier preferably comprises at least one bias current source which is coupled to the differential transistors in order to set their operating point.

The differential amplifier preferably comprises two differential transistors and a resistor which couples a respective connection on the controlled paths of the differential transistors to one another.

The configuration of the present invention advantageously makes it possible for the operating point, on the one hand, and the amplitude of the signal, on the other, to be set independently of one another.

The coupling between the differential amplifier and the input of the multiplier is preferably designed to carry differential signals.

The differential or symmetrical design of the circuit in one example, particularly of the coupling between the differential amplifier output and the multiplier input, is advantageous particularly with respect to smaller interference signal influences.

The coupling between the differential amplifier and the multiplier input comprises at least one current mirror. The current mirror firstly ensures that a desired current ratio can be set. Secondly, the circuit may also be operated at a particularly low supply voltage, since only a small voltage drop arises at the base point of the actual multiplier transistors in the Gilbert cell, that is to say between the common emitter or source node thereof and ground.

The first signal input of the radio-frequency mixer arrangement preferably has the output of a digital/analog converter coupled to it.

The digital/analog converter is preferably used to convert a digital baseband signal into an analog modulation signal in a transmission arrangement.

The radio-frequency mixer arrangement is preferably connected up to a further radio-frequency mixer arrangement in order to form a vector modulator. In this case, the further radio-frequency mixer arrangement may advantageously have the same advantageous design described above as the radio-frequency mixer arrangement already described.

To form a vector modulator, the outputs of the two radio-frequency mixer arrangements are preferably combined with one another using a summing element. The two radio-frequency mixer arrangements are actuated at their carrier-frequency or local-oscillator inputs preferably using a signal generator and a 0°/90° phase splitter.

Alternatively, the radio-frequency mixer arrangement may preferably also be used in a polar modulator. In a polar modulator, the amplitude and phase information is modulated separately. In this case, the proposed radio-frequency mixer is preferably used as an amplitude modulator in the polar modulator.

Overall, reducing the negative-feedback resistance in a differential amplifier achieves a high baseband amplitude without reducing the linearity of the differential amplifier. As a result, virtually no distortions arise, advantageously, in the low-frequency baseband path, where distortions would otherwise appear as nonlinear mixing products at the radio-frequency output of the modulator.

The high baseband signal amplitude which can be attained in line with the proposed invention advantageously produces a high power level at the modulator output. The proposed circuit uses particularly little current, since a large bias current is not required for providing high linearity.

The signal-to-noise ratio (SNR) of the modulation signal is particularly high on account of the high signal level.

It is advantageously possible to dispense with a discrete surface acoustic wave (SAW) filter at the modulator output without violating mobile radio specifications such as GSM (Global System for Mobile communication) in terms of transmission noise in the reception band.

Disturbing common-mode signals on the supply lines are preferably suppressed on account of the differential or symmetrical design of the circuit.

The bias current sources in one example permit additional stabilization of the quiescent current in the differential amplifier.

The proposed radio-frequency mixer arrangement may preferably be used, by way of example, in transceiver circuits which are produced using integrated technology and, by way of example, may be used for the mobile radio specifications based on Bluetooth or WLAN (Wireless Local Area Network), in "single-chip applications".

BRIEF DESCRIPTION OF THE DRAWINGS

The invention is explained in more detail below using a plurality of exemplary embodiments with reference to drawings, in which.

DETAILED DESCRIPTION OF THE INVENTION

Figure 1:
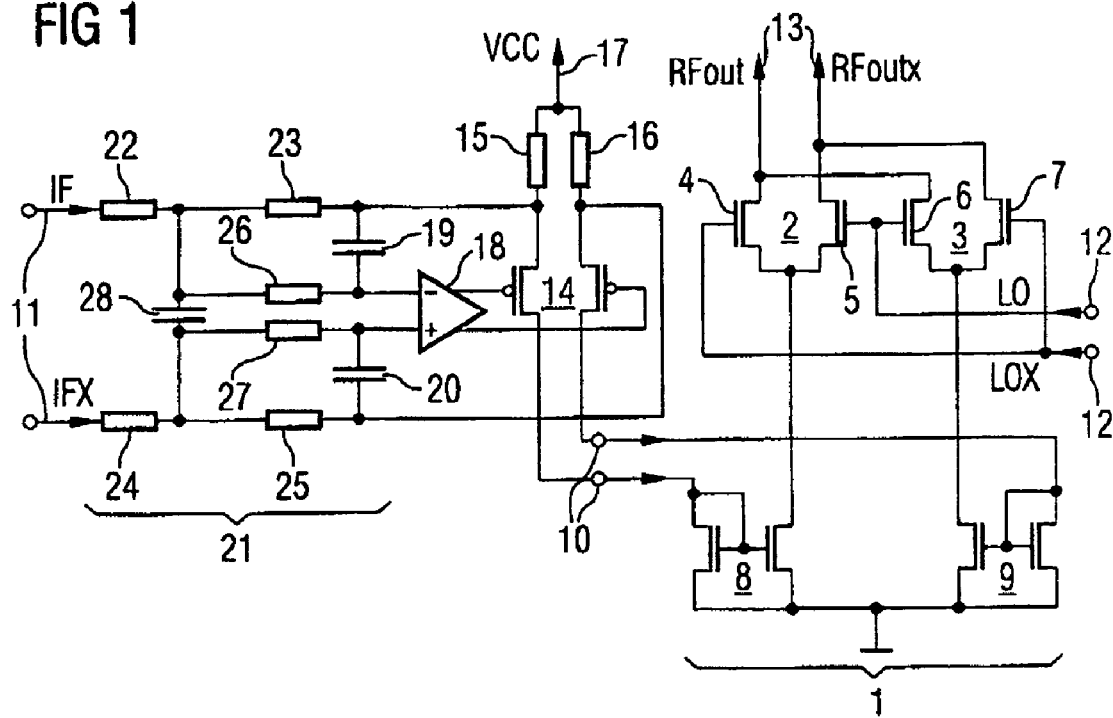
FIG. 1 shows a circuit diagram of an exemplary embodiment of a radio-frequency mixer arrangement in accordance with one aspect of the present invention.

FIG. 1 shows a radio-frequency mixer arrangement having a Gilbert multiplier 1 which comprises two differential stages 2, 3. The differential stages 2, 3 each have two n-channel MOS differential transistors 4, 5; 6, 7 whose sources are connected to one another in respective pairs. The common source connections of the differential stages 2, 3 are connected to an input current interface 10 on the multiplier 1 via a respective current mirror 8, 9. A first signal input 11, which is designed to supply a differential signal and accordingly comprises two input terminals, is coupled to the current interface 10 via a block with an antialiasing filter, an operational amplifier and differential amplifier, as explained in more detail below. The first signal input 11 can have a baseband or intermediate frequency signal IF, IFX supplied to it.

A second signal input 12 on the multiplier 1 is likewise designed to supply a differential signal and, in the present case, is designed to supply a local oscillator or carrier signal LO, LOX. The second signal input 12 comprises two input terminals, one of which is connected to the gate connections of the transistors 5, 6 in the differential stages 2, 3 and another of which is connected to the gate connections of the other transistors 4, 7 in the differential stages 2, 3. The multiplier 1 has a signal output 13 at which a multiplied signal RFout, RFoutx can be tapped off and which is likewise of symmetrical design. To form the output terminal pair 13, the drain connections of the transistors 4, 6 are connected to one another, and the drain connections of the transistors 5, 7 are connected to one another. Overall, cross coupling of the differential stages 2, 3 is obtained.

The input 10 of the multiplier is connected to the output of a differential amplifier 14 which comprises two p-channel MOS field effect transistors. A respective connection on the controlled paths of the transistors in the differential amplifier 14 is connected to the symmetrical signal input 10 of the multiplier, and a respective further connection on said controlled paths is connected to a supply potential connection 17 via a respective resistor 15, 16. The supply potential connection 17 is used to supply a supply voltage VCC. The gate connections of the differential amplifier 14 are connected to a respective output on an operational amplifier 18. The operational amplifier 18 has a differential signal output. In addition, the connecting node between the resistors 15, 16 and the transistors in the differential amplifier 14 is connected to a respective input on the operational amplifier 18 via a respective capacitance 19, 20. Consequently, the fully differential operational amplifier 18 has a symmetrical feedback path which contains the differential amplifier 14 and the capacitances 19, 20 connected together.

The capacitances 19, 20 form an antialiasing filter 21 which is accordingly likewise arranged in the feedback path of the operational amplifier 18. In addition, the antialiasing filter 21 is used to couple the first signal input 11 of the radio-frequency mixer arrangement to the inputs of the operational amplifier 18 and hence also to the inputs of the differential amplifier 14 and to the current interface 10, which forms the current input of the multiplier 1. Connected between the input 11 and a respective connection on the capacitances 19, 20 is a respective series circuit comprising two resistors 22, 23; 24, 25. The connecting nodes in the series circuits 22, 23; 24, 25 are coupled firstly to the inputs of the operational amplifier 18 via a respective further resistor 26, 27 and secondly to one another via a further capacitance 28. The series circuits 22, 23; 24, 25 accordingly also connect the first signal input 11 to those connections on the transistors in the differential amplifier 14 which are connected to supply potential connection 17 via resistors 15, 16.

The operational amplifier 18 with the differential amplifier 14 and the filter 21 in the feedback path is also used to convert a voltage signal applied to the signal input 11 into a current signal which is supplied to the actual multiplier core 2, 3 via the current mirrors 8, 9.

The capacitances 19, 20 and the coupling capacitance 28 which are situated in the feedback paths of the operational amplifier 18 produce a multiple-order filter characteristic which performs the function of an antialiasing filter 21 having low-pass characteristics. This is advantageous particularly since a baseband signal is normally supplied at the signal input 11 via a digital/analog converter.

The control loop formed using the operational amplifier 18 means that the output signal from the differential amplifier 14 is highly linear.

The proposed circuit arrangement results in a high level of linearity, which means that virtually no distortions arise in the low-frequency baseband path, which distortions might otherwise appear as nonlinear mixing products at the radio-frequency output of the modulator.

In addition, it is possible to dispense with a discrete surface acoustic wave filter at the modulator output, in line with one example of the proposed invention, without violating the GSM specification in terms of transmission noise in the reception band.

The fully differential or symmetrical design of the circuit means that disturbing common-mode signals on the supply lines are suppressed.

In accordance with the present invention, the differential amplifier at the mixer input and the antialiasing low-pass filter are not in the form of separate circuit blocks, but rather are combined with the operational amplifier's feedback path and form a unit.

The proposed circuit is particularly suitable for use for Bluetooth or wireless LAN appliances, for example, in "single-chip applications".

Figure 2:
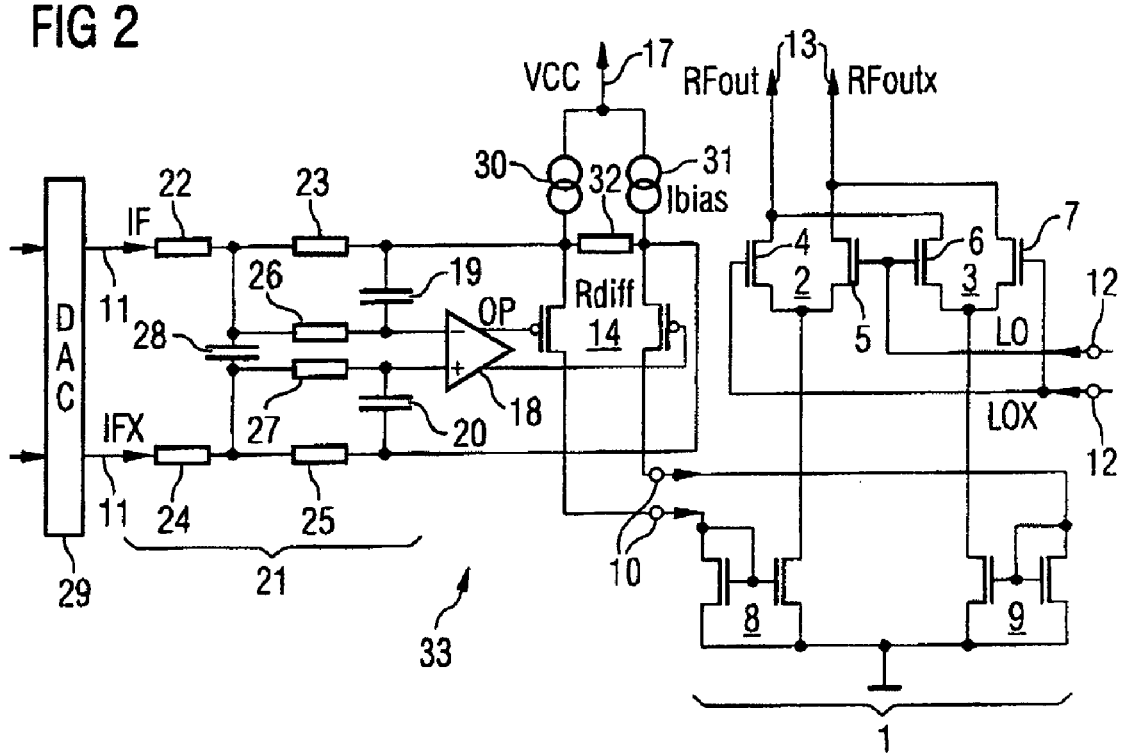
FIG. 2 shows a further exemplary embodiment of a radio-frequency mixer arrangement according to the present invention.

FIG. 2 shows a development of the radio-frequency mixer arrangement from FIG. 1 and largely corresponds thereto in terms of design and advantageous action. In this respect, the description will not be repeated at this juncture. In addition to the circuit from FIG. 1, the first signal input 11 of the radio-frequency mixer arrangement has the output of a digital/analog converter 29 connected to it. The inputs of the digital/analog converter 29 preferably have a digital signal processor (not shown here) connected to them which produces a baseband signal. In FIG. 2, the differential amplifier 14 is not connected to the supply potential 17 via resistors 15, 16, but rather two bias current sources 30, 31 are provided which are connected between the supply potential connection 17 and a respective connection on a respective controlled path of the transistors in the differential amplifier 14. In addition, a resistor 32 is provided which couples the connecting nodes between the current sources 30, 31 and the transistors in the differential amplifier 14 to one another.

The resistor 32 is used to set the amplitude. The current sources 30, 31 are used to set operating points.

The reduced negative feedback resistance in the differential amplifier results in a particularly high baseband amplitude being achieved without the linearity of the differential amplifier being reduced as a result. In addition, the high baseband signal amplitude produces a high power level at the output of the modulator. The circuit additionally uses particularly little current, because a large bias current is not required for attaining the high linearity. The high signal level means that the signal-to-noise ratio of the modulator signal is also particularly high.

The current sources 30, 31 and the differential resistor 32 allow the operating points of the differential amplifier transistors in the amplifier 14 and the signal amplitude to be set and optimized independently of one another.

Figure 3:
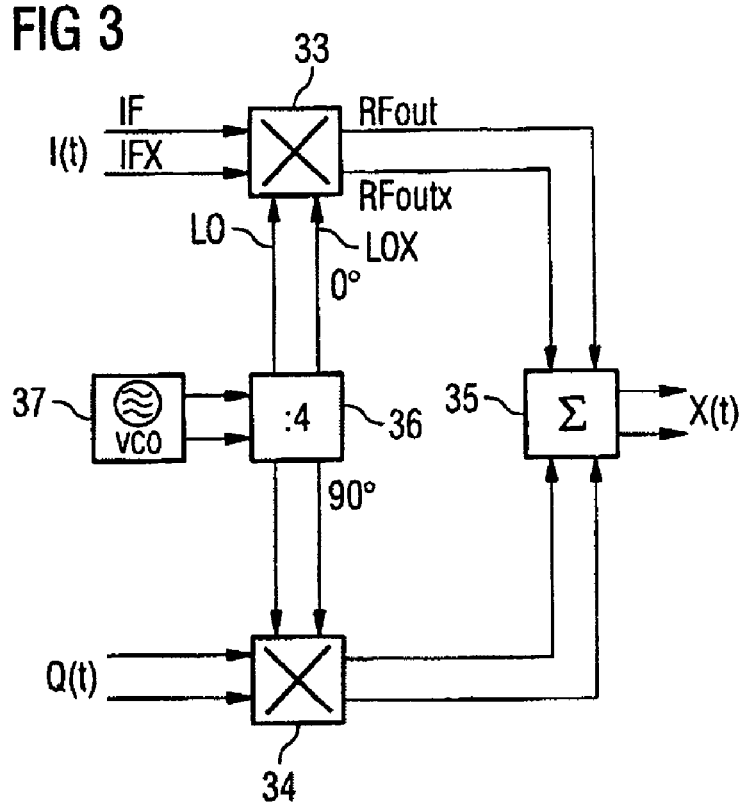
FIG. 3 shows a block diagram of an application of the radio-frequency mixer arrangement of the present invention in a vector modulator.

FIG. 3 shows a vector modulator which comprises two radio-frequency mixer arrangements 33, 34 which both have the design shown in FIG. 1 or in FIG. 2, for example. The first signal inputs of the radio-frequency mixer arrangements are used for supplying a complex baseband signal which is split into in phase and quadrature signal components I,Q. The radio-frequency outputs of the two radio-frequency mixers 33, 34 are connected to inputs on a summing element 35 whose output forms the output of the vector modulator. The two signal inputs of the radio-frequency mixers 33, 34 are connected to outputs on a 0°/90° phase splitter 36 which is designed as a four-way frequency divider in the present case. An input of the frequency divider 36 is connected to the output of a signal generator 37 which comprises a voltage controlled oscillator.

The vector modulator is used to convert a complex baseband or intermediate frequency signal which is split into in phase and quadrature components to a radio-frequency carrier.

When used in the vector modulator, the advantages of the proposed mixer, such as good linearity, high output power and low output noise, can be used particularly advantageously.

Figure 4:
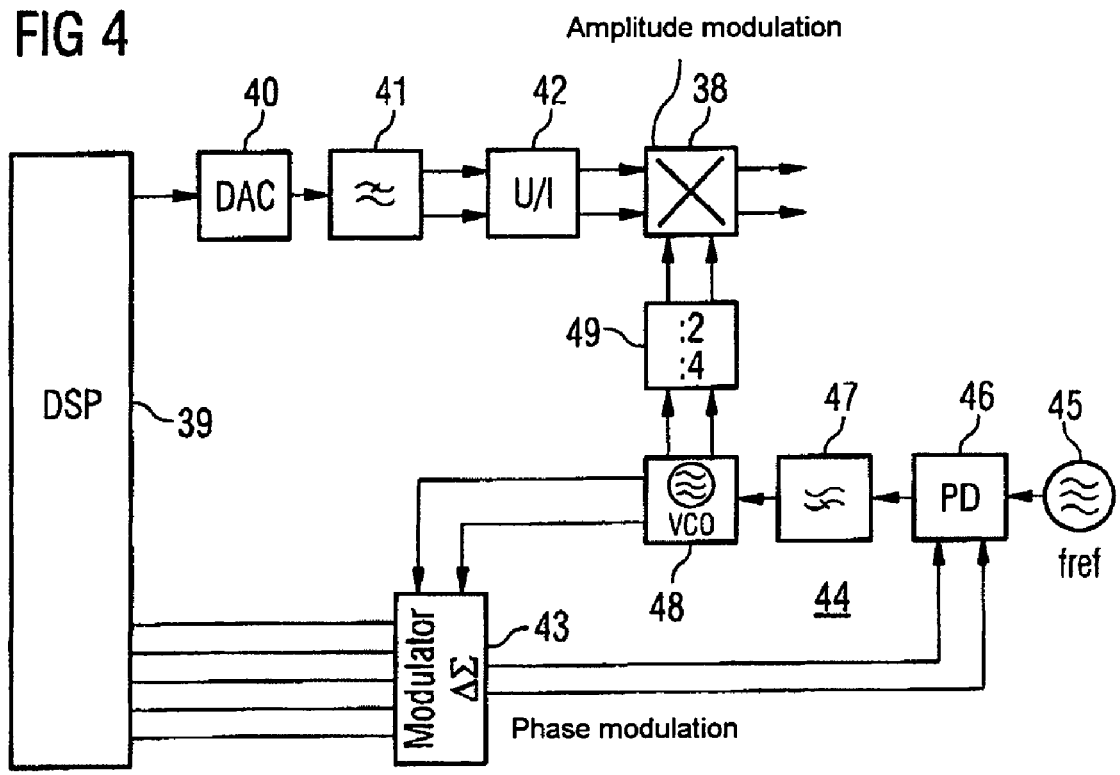
FIG. 4 shows a block diagram of an exemplary application of the radio-frequency mixer arrangement of the present invention in a polar modulator.

FIG. 4 shows a further example of application of the proposed radio-frequency mixer arrangement, as is shown in FIG. 1 or FIG. 2. The figure shows a polar modulator which is distinguished in that the amplitude and phase modulation is carried out at different points. Accordingly, the complex baseband signal is not split into in phase and quadrature components, but rather a complex variable is represented in another manner, namely using polar co-ordinates and split into amplitude and phase.

The amplitude modulation is performed in an amplitude modulator 38 which is designed as a radio-frequency mixer arrangement based on the present principle. The amplitude information in a digitally modulated baseband signal is provided in a digital signal processor 39 and is supplied to the amplitude modulator 38 via a digital/analog converter 40, a low-pass filter 41 and a voltage/current converter 42. In this case, the D/A converter 40 corresponds to the D/A converter 29 from FIG. 2, the low-pass filter 41 corresponds to the antialiasing filter 41, and the voltage/current converter 42 in FIG. 2 is likewise provided by the unit comprising filter, operational amplifier 18 and differential amplifier 14. The phase information in the digitally modulated baseband signal, which information is likewise provided by the signal processor 39, is supplied to a digital $\Sigma\Delta$ (sigma-delta)

modulator 43 which is arranged in the feedback path of a phase locked loop 44, for example in combination with a multimodulus divider. The phase locked loop 44 comprises a reference frequency generator 45 whose output signal is compared in a phase detector 46 with the output signal from the modulator block 43. The output signal from the phase detector 46 is routed via a loop filter 47 to a voltage controlled oscillator 48 which in turn actuates the modulator 43. In addition, the already phase-modulated carrier signal is routed via a frequency divider 49 to the local-oscillator or carrier-frequency input of the radio-frequency mixer arrangement 38.

Accordingly, a digitally modulated baseband signal is first split into phase and amplitude in the signal processor 39. Such a signal is an 8-PSK modulation signal, for example. This modulation method is also referred to as phase shift keying. Such signals are used, by way of example, in the mobile radio standard GSM (Global System for Mobile communication) EDGE. The oscillator 48 is modulated on the basis of the phase information in a phase locked loop 44. The amplitude modulation of the phase-modulated carrier signal provided by the oscillator takes place in the radio-frequency mixer 38. In this case, the amplitude modulator 38 requires particularly good linearity characteristics. These are ensured by the structure corresponding to the present invention, as shown by way of example in FIGS. 1 and 2.

It goes without saying that it is within the framework of the invention for the proposed radio-frequency mixer arrangement also to be designed using transistors other than unipolar MOS field effect transistors, for example using bipolar or BICMOS circuitry.

The present invention may also be used advantageously for other radio-frequency arrangements besides vector and polar modulators which require linear radio-frequency mixers or modulators.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, units, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A radio-frequency mixer arrangement, comprising:
   a multiplier circuit;
   a differential amplifier circuit comprising an input and an output, the output of the differential amplifier coupled to a first input of the multiplier circuit;
   an operational amplifier circuit comprising an input and an output, the output of the operational amplifier coupled to the input of the differential amplifier, and a feedback path from the output of the operational amplifier to the input of the operational amplifier, wherein the feedback path contains the differential amplifier circuit;
   a first signal input of the radio-frequency mixer coupled to the input of the operational amplifier circuit;
   a second signal input of the radio-frequency mixer coupled to a second input of the multiplier circuit; and
   at least one capacitance element in the feedback path between the output of the differential amplifier circuit and the input of the operational amplifier circuit, wherein the capacitance element operates in the feedback path as an anti-aliasing filter.

2. The radio-frequency mixer arrangement as claimed in claim 1, wherein the differential amplifier circuit comprises two differential transistors each having a respective control input, wherein the operational amplifier circuit comprises an output terminal pair for tapping off a differential signal, and wherein the control inputs of the differential amplifier circuit are coupled to the output terminal pair of the operational amplifier.

3. The radio-frequency mixer arrangement as claimed in claim 2, wherein the differential amplifier circuit further comprises at least one bias current source coupled to the two differential transistors in the differential amplifier circuit, and configured to set an operating point associated therewith.

4. The radio-frequency mixer arrangement as claimed in claim 3, wherein the differential amplifier circuit further comprises a resistor coupled between output terminals of the two differential transistors.

5. The radio-frequency mixer arrangement as claimed in claim 1, wherein a coupling between the differential amplifier circuit and the input of the multiplier circuit is configured to receive differential signals.

6. The radio-frequency mixer arrangement as claimed in claim 1, wherein a coupling between the differential amplifier circuit and the input of the multiplier circuit comprises at least one current mirror circuit.

7. The radio-frequency mixer arrangement as claimed in claim 1, further comprising a digital/analog converter having an output coupled to the first signal input of the radio-frequency mixer arrangement.

8. The radio-frequency mixer arrangement as claimed in claim 1, wherein the radio-frequency mixer arrangement is connected to another further radio-frequency mixer arrangement and collectively configured to form a vector modulator.

9. The radio-frequency mixer arrangement as claimed in claim 1, further comprising a processor, a digital/analog converter, and a phase locked loop coupled to the mixer arrangement and collectively configured to form a polar modulator.

10. A radio-frequency mixer circuit, comprising:
    a multiplier circuit comprising first and second inputs, and an output forming an output of the mixer circuit, wherein an output signal thereat comprises the transmission frequency level signal that is a function of a processed analog baseband or intermediate frequency signal and a local oscillator or carrier signal at the first and second inputs, respectively;
    a differential amplifier circuit comprising an input and an output, wherein the output is coupled to the first input of the multiplier circuit and supplies the processed analog baseband or intermediate signal thereto;

an operational amplifier circuit comprising an input configured to receive the input baseband or intermediate frequency signal as the mixer circuit input, and an output coupled to the input of the differential amplifier circuit; and an anti-aliasing filter circuit coupled between the differential amplifier and the input of the operational amplifier circuit in a feedback path thereof, wherein the anti-aliasing filter circuit cooperatively operates with the differential amplifier circuit and the operational amplifier circuit to provide the processed analog baseband or intermediate frequency signal to the first input of the multiplier circuit having a high degree of linearity.

11. The mixer circuit of claim 10, wherein the anti-aliasing filter circuit comprises a capacitance element, wherein the capacitance element facilitates a reduction in distortion of the processed analog baseband or intermediate frequency signal.

12. The mixer circuit of claim 10, further comprising a current mirror circuit coupled between the output of the differential amplifier circuit and the first input of the multiplier circuit, wherein the current mirror circuit is operable to reduce noise associated with the processed analog baseband or intermediate frequency signal.

13. The mixer circuit of claim 10, wherein the differential amplifier circuit comprises a differential transistor pair having a first pair of terminals coupled to a supply voltage, a second pair of terminals forming the output of the differential amplifier circuit, and a pair of control terminals coupled to the output of the operational amplifier circuit.

14. The mixer circuit of claim 13, wherein the feedback path extends from the first pair of terminals of the differential transistor pair to the input of the operational amplifier circuit.

15. The mixer circuit of claim 13, further comprising a pair of current sources coupled between the supply voltage and the first pair of terminals of the differential transistor pair, respectively.

16. The mixer circuit of claim 15, further comprising a resistor coupled between the first pair of terminals of the differential transistor pair.

* * * * *